United States Patent
Hasegawa

(10) Patent No.: US 8,259,467 B2
(45) Date of Patent: Sep. 4, 2012

(54) MULTI-PIECE BOARD AND FABRICATION METHOD THEREFOR

(75) Inventor: Yasushi Hasegawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 461 days.

(21) Appl. No.: 12/537,586

(22) Filed: Aug. 7, 2009

(65) Prior Publication Data

US 2010/0124038 A1    May 20, 2010

(30) Foreign Application Priority Data

Nov. 20, 2008   (JP) ................................. 2008-297035

(51) Int. Cl.
*H05K 7/02*    (2006.01)

(52) U.S. Cl. ........ 361/810; 361/792; 361/807; 361/809; 361/813; 361/825

(58) Field of Classification Search ................. 174/255, 174/256, 259, 260; 361/729, 736, 748, 792, 361/807, 809, 810, 813, 825
See application file for complete search history.

(56) References Cited

U.S. PATENT DOCUMENTS

| | | | | |
|---|---|---|---|---|
| 5,174,197 | A * | 12/1992 | Upton | 99/449 |
| 7,129,578 | B2 * | 10/2006 | Togawa | 257/730 |
| 7,559,138 | B2 * | 7/2009 | Sin | 29/830 |
| 7,874,861 | B2 * | 1/2011 | Wang | 439/325 |
| 2005/0128725 | A1 * | 6/2005 | Choi et al. | 361/803 |
| 2008/0083561 | A1 * | 4/2008 | Hwang et al. | 174/255 |

FOREIGN PATENT DOCUMENTS

| | | |
|---|---|---|
| JP | 64-13178 | 1/1989 |
| JP | 5-93950 | 4/1993 |
| JP | 5-206590 | 8/1993 |
| JP | 2000-252605 | 9/2000 |
| JP | 2002-232089 | 8/2002 |
| JP | 2002-289986 | 10/2002 |
| JP | 2003-069190 | 3/2003 |
| JP | 2003-115657 | 4/2003 |
| JP | 2005-19693 | 1/2005 |
| JP | 2005-322878 | 11/2005 |
| JP | 2006-286949 | 10/2006 |
| JP | 2007-115855 | 5/2007 |

* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

A method of fabricating a multi-piece board includes: adhering a first frame element connected to multiple piece portions to a second frame element, the first frame element forming a board main portion of a multi-piece board, the first frame element and the second frame element forming a frame portion of the multi-piece portion, thereby yielding the multi-piece board; mounting multiple electronic components on the piece portions, respectively; separating the piece portions from the frame portion; separating, from the first frame element, the second frame element adhered thereto; and adhering the second frame element to a first frame element of another board main portion.

15 Claims, 9 Drawing Sheets

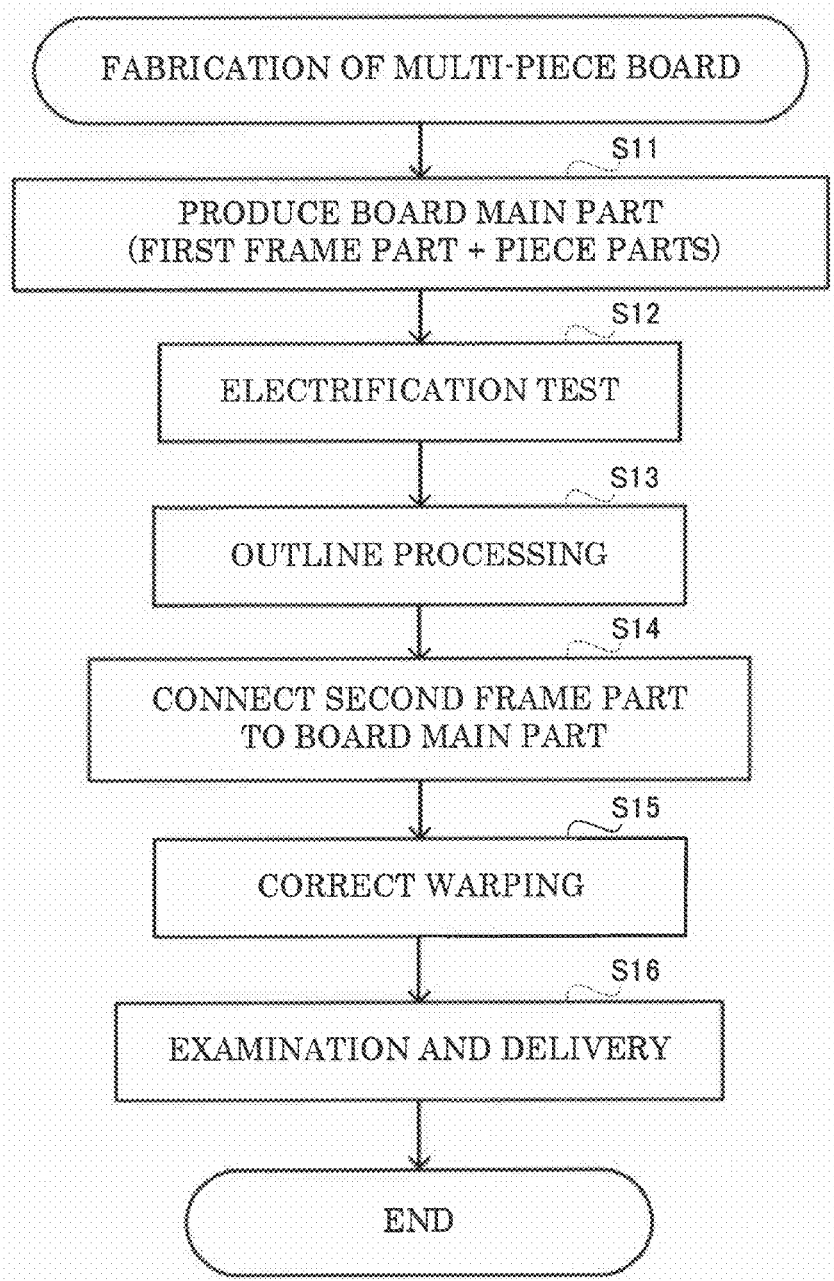

MULTI-PIECE BOARD AND FABRICATION METHOD THEREFOR

CROSS REFERENCE TO RELATED APPLICATIONS

The present application claims the benefits of priority to Japanese Patent Application No. 2008-297035, which was filed on Nov. 20, 2008. The entire contents of Japanese Patent Application No. 2008-297035 are herein incorporated by reference.

BACKGROUND OF THE INVENTION

1. Field of the Invention

The present invention relates to a multi-piece board having a frame part as a coupling member and a plurality of piece parts, and a method of fabricating the same.

2. Description of the Related Art

For example, Unexamined Japanese Patent Application Publication No. 2002-289986, Unexamined Japanese Patent Application Publication No. 2002-232089, Unexamined Japanese Patent Application Publication No. 2003-69190, Unexamined Japanese Patent Application Publication No. 2007-115855, and Unexamined Japanese Patent Application Publication No. 2005-322878 describe methods of fabricating multi-piece boards. Those multi-piece boards each has a frame part, and multiple piece parts connected to the frame part. When a multi-piece board includes a defective piece, a user separates the defective piece from the frame and attaches a good (defect-free) piece thereto instead.

The contents of Unexamined Japanese Patent Application Publication No. 2002-289986, Unexamined Japanese Patent Application Publication No. 2002-232089, Unexamined Japanese Patent Application Publication No. 2003-69190, Unexamined Japanese Patent Application Publication No. 2007-115855, and Unexamined Japanese Patent Application Publication No. 2005-322878 are herein incorporated in their entirety.

SUMMARY OF THE INVENTION

According to the first aspect of the invention, there is provided a method of fabricating a multi-piece board having a frame and piece parts, the method includes: adhering a first frame element connected to a plurality of piece portions to a second frame element, the first frame element forming a board main portion of a multi-piece board, the first frame element and the second frame element being configured to form a frame portion of the multi-piece board, thereby yielding the multi-piece board; mounting electronic components on the plurality of piece portions, respectively; separating the plurality of piece portions from the frame portion; separating, from the first frame element, the second frame element adhered thereto; and adhering the second frame element separated to a first frame element of another board main portion.

According to the second aspect of the invention, a multi-piece board includes: a board main portion having a first frame element and a plurality of piece portions each having a printed wiring board, the plurality of piece portions being connected to the first frame element; and a second frame element adhered to the first frame element of the board main portion. The first frame element and the second frame element form a frame portion of the multi-piece board. The first frame element separates from the board main portion of the multi-piece board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a flowchart illustrating procedures of the fabrication method for a multi-piece board according to one embodiment of the invention;

DETAILED DESCRIPTIONS OF THE PREFERRED EMBODIMENT

Figure 1:
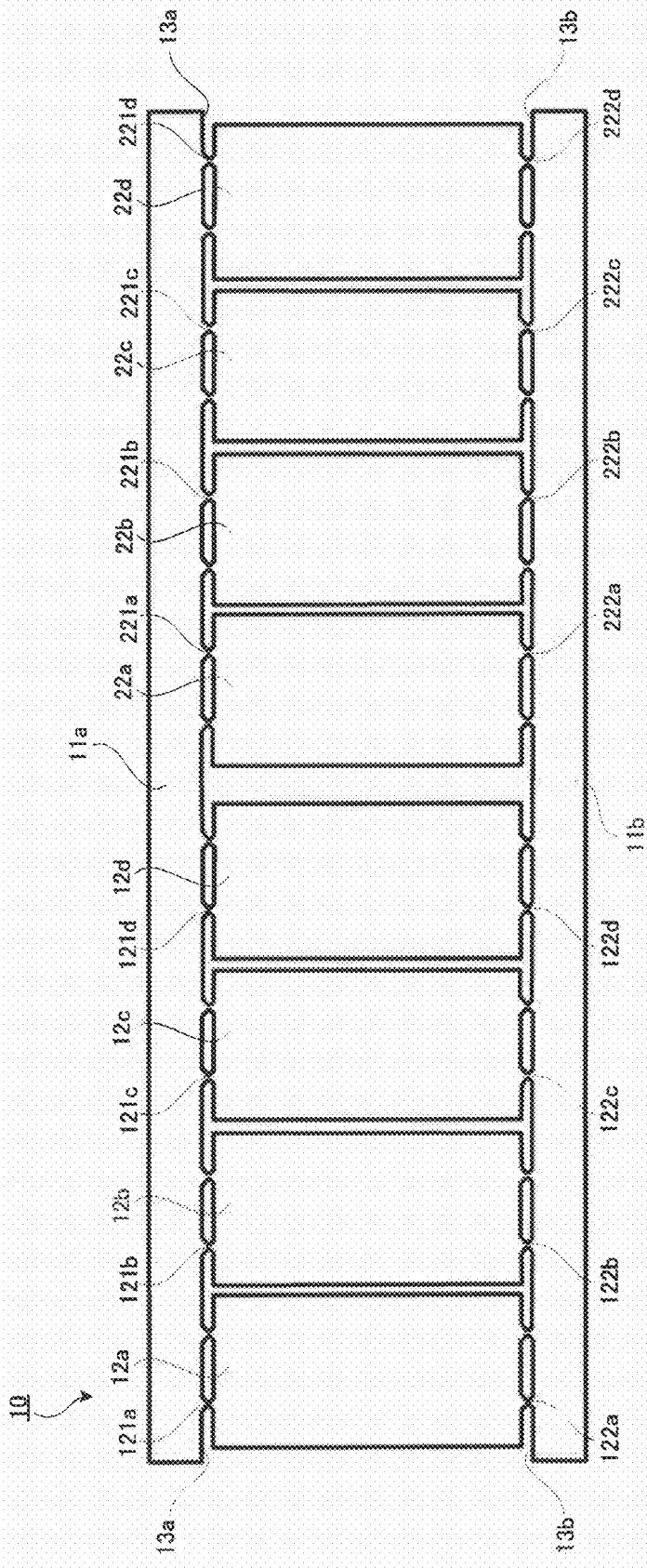
FIG. 1 is a plan view showing a multi-piece board to be fabricated.

The embodiment will now be described with reference to the accompanying drawings, wherein like reference numerals designate corresponding or identical elements throughout the various drawings.

As shown in FIG. 1, for example, a multi-piece board 10 to be fabricated according to an embodiment has frame parts 11a and 11b as coupling portions, and piece parts 12a, 12b, 12c, 12d, 22a, 22b, 22c and 22d.

The frame parts 11a and 11b are two long bar-like parts sandwiching the successive piece parts 12a to 12d and 22a to 22d. The shape of the frame parts 11a and 11b is not limited to the bar shape. The shape of the frame parts 11a and 11b is optional, and may be, for example, a parallelogram, circular or elliptical frame surrounding the piece parts 12a to 12d and 22a to 22d. The frame parts 11a and 11b are formed of, for example, an insulating material, which is optional.

Each of the piece parts 12a to 12d and 22a to 22d is a rectangular rigid printed wiring board. The rigid printed wiring board includes circuits of, for example, an electronic device. It is to be noted that the shape of the piece parts 12a to 12d and 22a to 22d is optional, and may be, for example, a parallelogram, circular or elliptical shape. The piece parts 12a to 12d and 22a to 22d are not limited to a rigid printed wiring board. For example, each piece part may be a flexible printed wiring board. Each piece part may also be a flex-rigid printed wiring board. In addition, each piece part may be a printed wiring board having an electronic part built therein. Further, each piece part may be a printed wiring board having a cavity formed in the top surface thereof. Those different types of printed wiring boards may be combined on a single multi-piece board 10. Further, in the combination of different types of printed wiring boards or the combination of printed wiring boards of the same type, a low-density printed wiring board and a high-density printed wiring board may be combined.

The low-density printed wiring board is a printed wiring board having a lower wiring density than the high-density printed wiring board.

Slits 13a and 13b are formed between the frame part 11a, 11b and the piece parts 12a to 12d and 22a to 22d, excluding those portions of bridges 121a to 121d and 221a to 221d and bridges 122a to 122d and 222a to 222d as shown in FIG. 1. That is, the frame part 11a is connected to the piece parts 12a to 12d and 22a to 22d via the bridges 121a to 121d and 221a to 221d, respectively, while the frame part 11b is connected to the piece parts 12a to 12d and 22a to 22d via the bridges 122a to 122d and 222a to 222d, respectively.

The bridges 121a to 121d and 221a to 221d, and bridges 122a to 122d and 222a to 222d are formed of, for example, an insulating material, which is optional.

In case of fabricating the multi-piece board 10, for example, a series of processes illustrated in FIG. 2 are carried out.

Figure 3A:
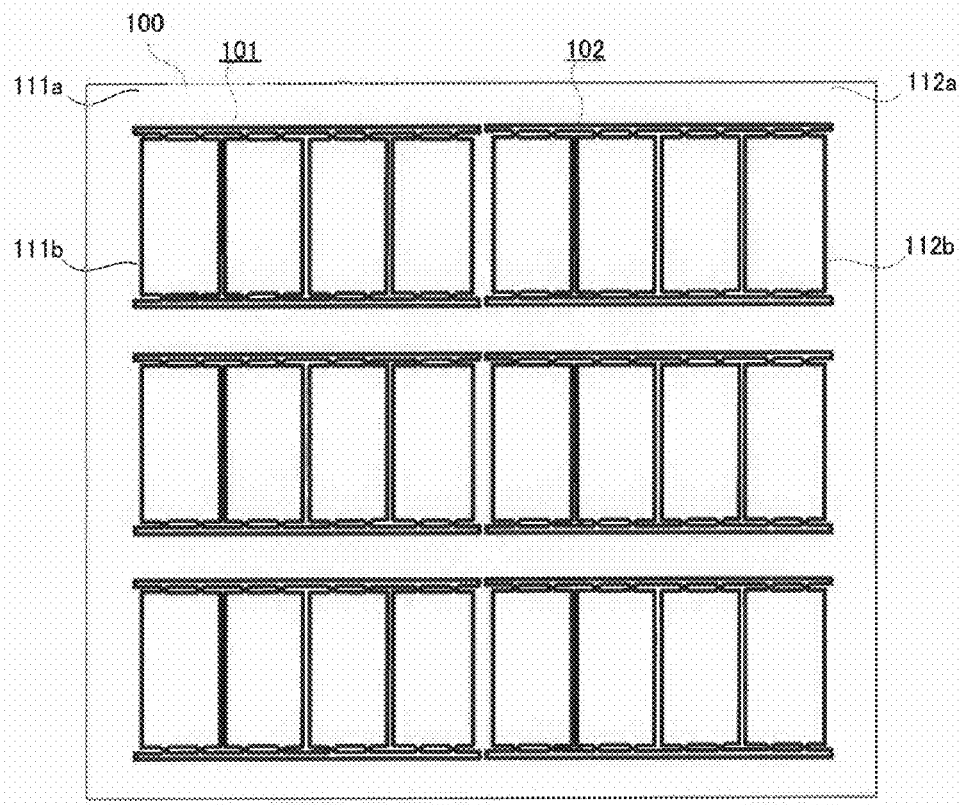
FIG. 3A is a diagram for explaining a step of producing a board main part at a first production panel.

First, in step S11, board main parts 101 and 102, equivalent to a part of the multi-piece board 10, are produced at a production panel 100 as shown in, for example, FIG. 3A. While multiple (three or more) board main parts are produced at a single production panel 100 in the example of FIG. 3A, the quantity of board main parts to be produced may just be the number of board main parts in use, i.e., only two board main parts 101 and 102.

Figure 3B:
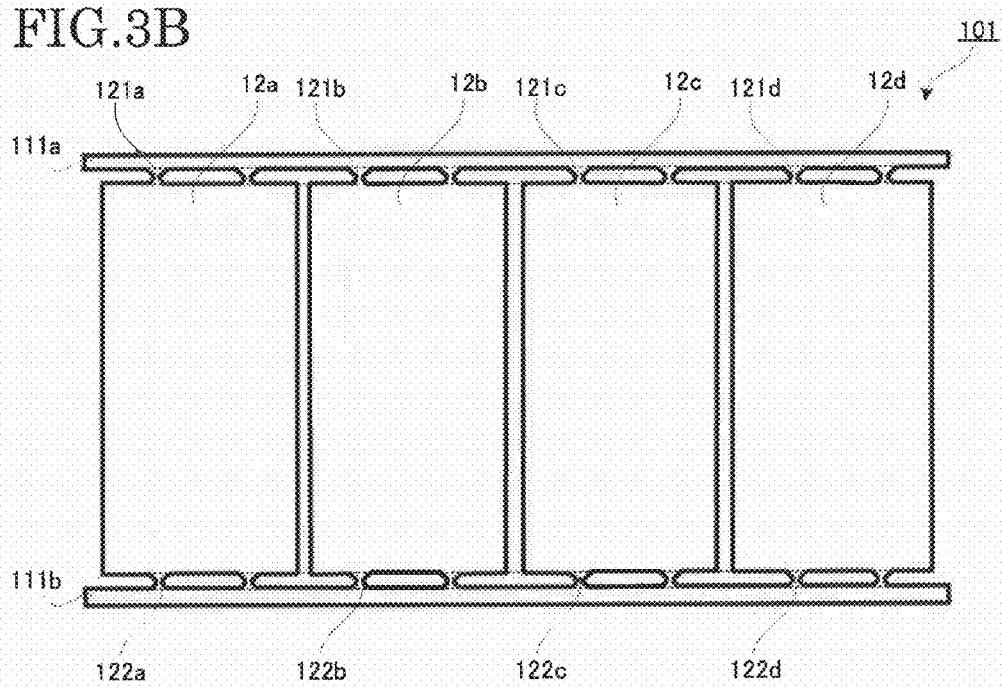
FIG. 3B is an enlarged view of the board main part.

The board main parts 101 and 102 respectively include first frame parts 111a, 111b, and 112a, 112b equivalent to a part of the frame parts 11a and 11b, piece parts 12a to 12d, and 22a to 22d, bridges 121a to 121d, and 221a to 221d, and bridges 122a to 122d, and 222a to 222d. As shown in FIG. 3B of the board main part 101 in enlargement, the first frame parts 111a, 111b, and 112a, 112b are equivalent to the lower end portions (piece-side long sides to be connected to the bridges) of the frame parts 11a and 11b.

The piece parts 12a to 12d, and 22a to 22d can be fabricated by laminating a prepreg impregnated with an uncured epoxy resin, polyimide resin, phenolic resin or the like on a base, such as a glass cloth, an unwoven cloth of aramid fibers, or paper, using a general fabrication method for, for example, a multilayer printed wiring board. It is to be however noted that the structure of the piece parts 12a to 12d and 22a to 22d is not limited to this particular type. Each of the piece parts 12a to 12d and 22a to 22d may be a printed wiring board acquired by alternate lamination of wiring layers and insulation layers on, for example, a ceramic base.

The first frame parts 111a, 111b, and 112a, 112b, the bridges 121a to 121d, and 221a to 221d, and the bridges 122a to 122d, and 222a to 222d are formed by, for example, a silk screen technique, photolithography technique or the like.

Subsequently, in step S12, an electrification test is performed on the board main parts 101 and 102. Any piece part, if determined as a defective part in the electrification test, will be corrected or discarded. In later steps, those piece parts which are determined as defect-free will be used. The defective piece parts are replaced with defect-free ones supplied from, for example, another board main part.

Figure 4:
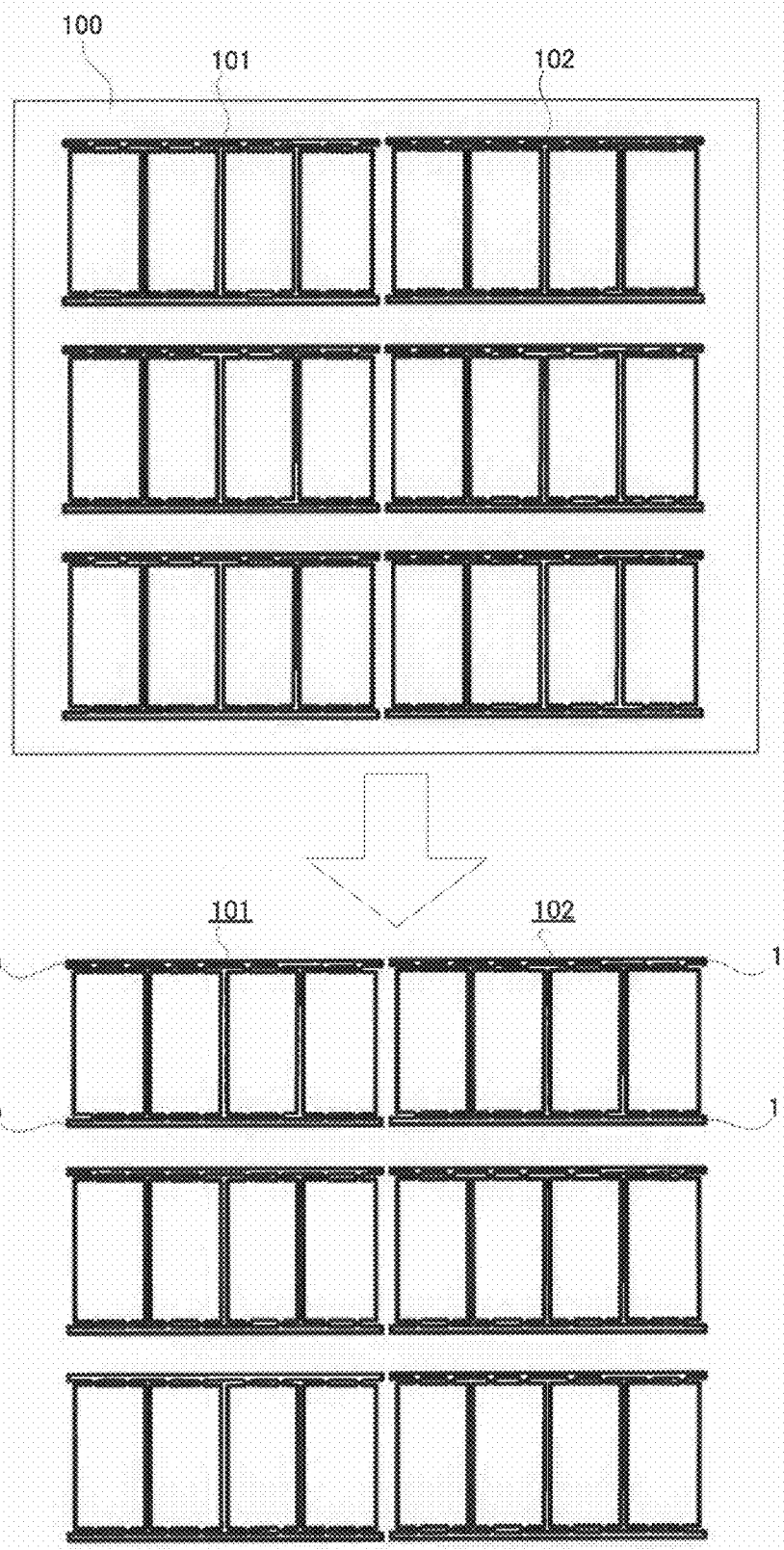
FIG. 4 is a diagram for explaining a step of performing outline of the board main part.

In next step S13, the board main parts 101 and 102 in predetermined outside dimensions (design values) are separated with an ordinary router machine (router having no alignment capability) as shown in, for example, FIG. 4. That is, the outline processing of the board main parts 101 and 102 is carried out. An alignment router or the like may be used in place of the ordinary router machine.

Figure 5:
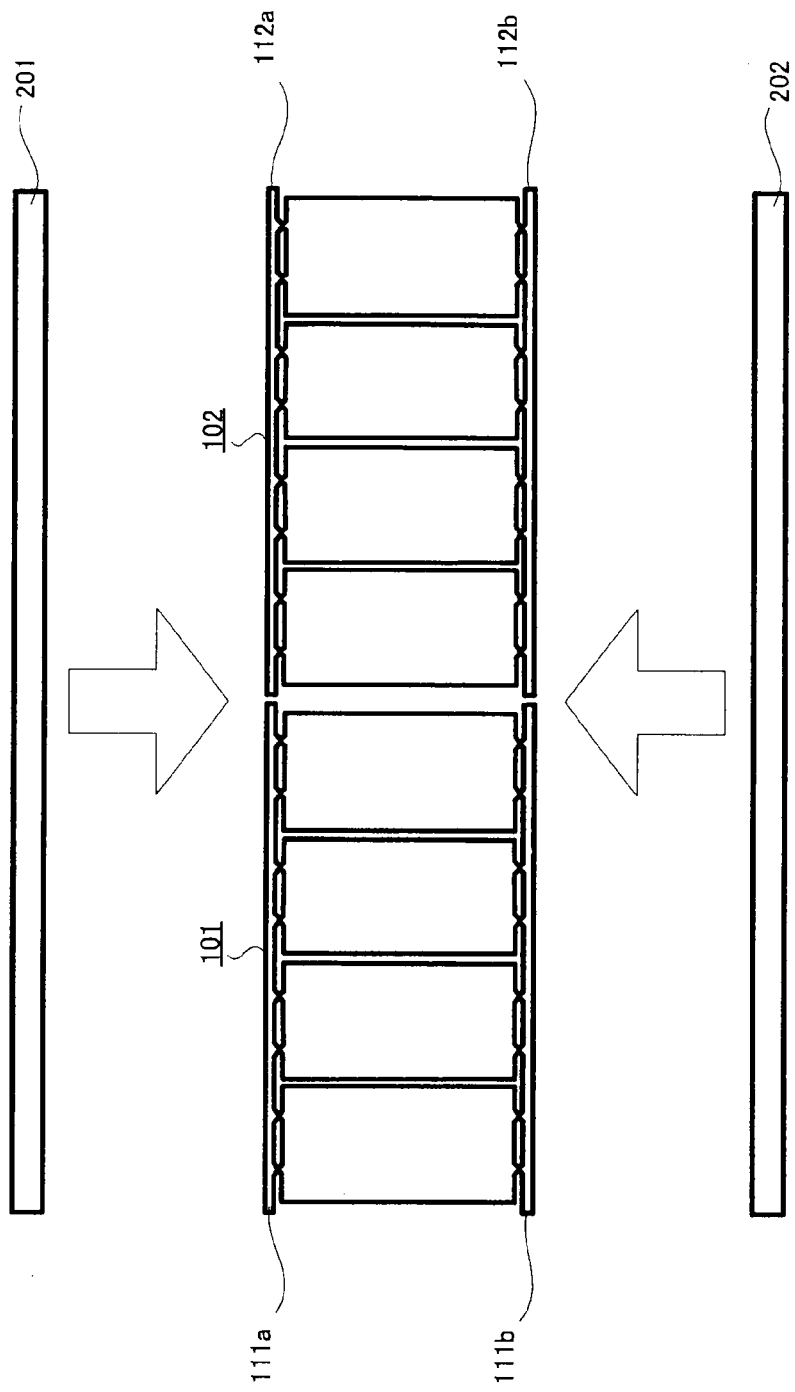
FIG. 5 is a diagram for explaining a step of connecting a second frame part to a first frame part of the board main part.

In next step S14, second frame parts 201, 202 are connected to the first frame parts 111a, 111b, and 112a, 112b of the board main parts 101 and 102, as shown in FIG. 5. The second frame parts 201 and 202 are other portions of the frame parts 11a and 11b than the first frame parts 111a, 111b, and 112a, 112b. The second frame parts 201, 202 are formed of, for example, aluminum. That is, the second frame parts 201 and 202 has a heat resistance higher than that of the board main parts 101 and 102, and is thus stronger in heat deterioration. The material for the second frame parts 201 and 202 is not limited to aluminum, and may be another heat resistive material, such as a metal other than aluminum. A material which can endure a high-temperature heat treatment and a repetitive heat treatment is particularly preferable. Forming the second frame parts 201 and 202 of such a material can ensure reuse of the material for the second frame parts 201 and 202.

The second frame parts 201 and 202 are prepared by, for example, processing an aluminum plate or reusing, in a later step (FIG. 8), what has been used previously.

Figure 6:
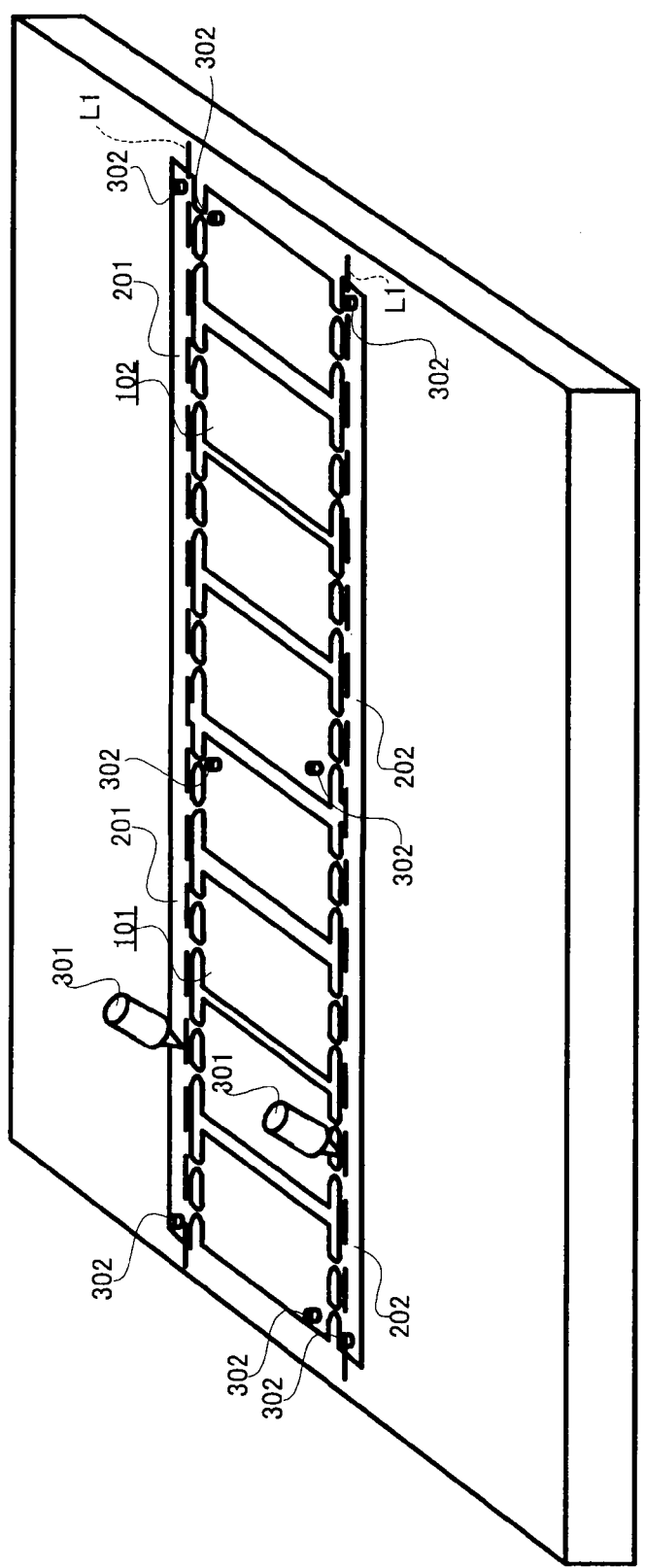
FIG. 6 is a diagram for explaining a step of connecting the board main part and the second frame part together.
Figure 7:
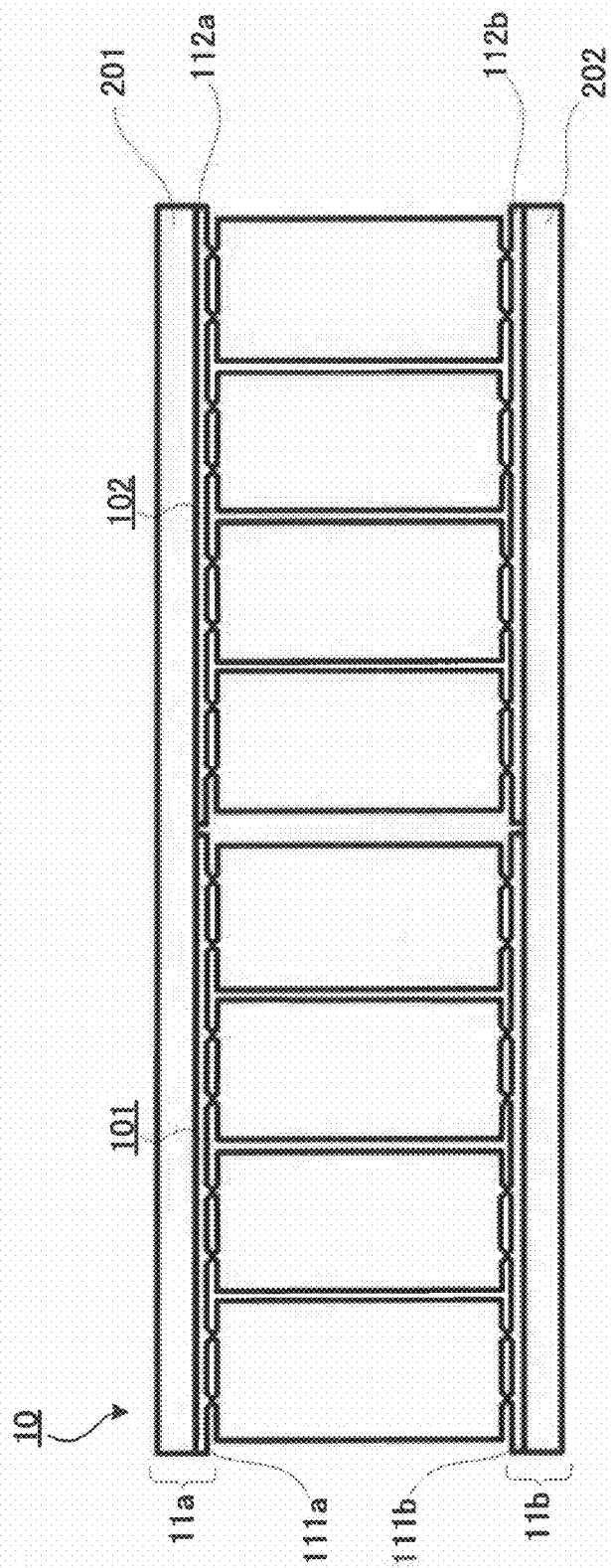
FIG. 7 is a plan view showing a multi-piece board according to one embodiment of the invention.

In step S14 in FIG. 2, the board main parts 101 and 102 and the second frame parts 201 and 202 are connected (adhered) together at an adhesion line L1 using, for example, a heat-hardening epoxy adhesive 301 as shown in FIG. 6. At this time, to avoid positional misalignment, the board main parts 101 and 102 and the second frame parts 201 and 202 are adhered while being secured with pins 302 set in the reference holes. The applied adhesive paste is subjected to a heat treatment in an oven at 100° C. for 20 minutes, for example, to be hardened. As a result, the board main parts 101 and 102 are connected to the second frame parts 201 and 202. The multi-piece board 10 as shown in FIG. 1 is thus fabricated. As shown in FIG. 7, the multi-piece board 10 has the second frame parts 201, 202 (reused parts) each of aluminum at the upper end portions of the frame parts 11a, 11b.

In next step S15, the worker corrects the warping of the board. Further, the multi-piece board 10 is subjected to an electrification test before being delivered in step S16.

Thereafter, an electrification test is performed on the piece parts 12a to 12d and 22a to 22d. If a defective piece is found in the electrification test, a cut and patch repair is performed to replace the defective piece with a defect-free piece produced separately. The replacement of a defective piece with a defect-free piece repairs the multi-piece board. With such repair, discarding of the whole multi-piece board can be avoided when the multi-piece board becomes partly defective, so that other defect-free pieces will not be wasted. This therefore improves the yield and the number of yielded products. As the electrification test has already been performed in step S12, this electrification test may be omitted according to the purpose or the like.

Through the foregoing processing, the multi-piece board with a collection of defect-free pieces is formed. A multi-piece board 10 can be delivered to a customer who then mounts electronic parts on the piece parts 12a to 12d, and 22a to 22d. The mounting temperature of electronic parts is normally about 200 to 300° C. The second frame parts 201 and 202 of aluminum have a heat resistance to the mounting temperature of electronic parts.

Subsequently, the piece parts 12a to 12d, and 22a to 22d are separated from the multi-piece board. Thereafter, the second frame parts 201 and 202 are reused by executing, for example, a series of processes illustrated in FIG. 8.

Figure 8:
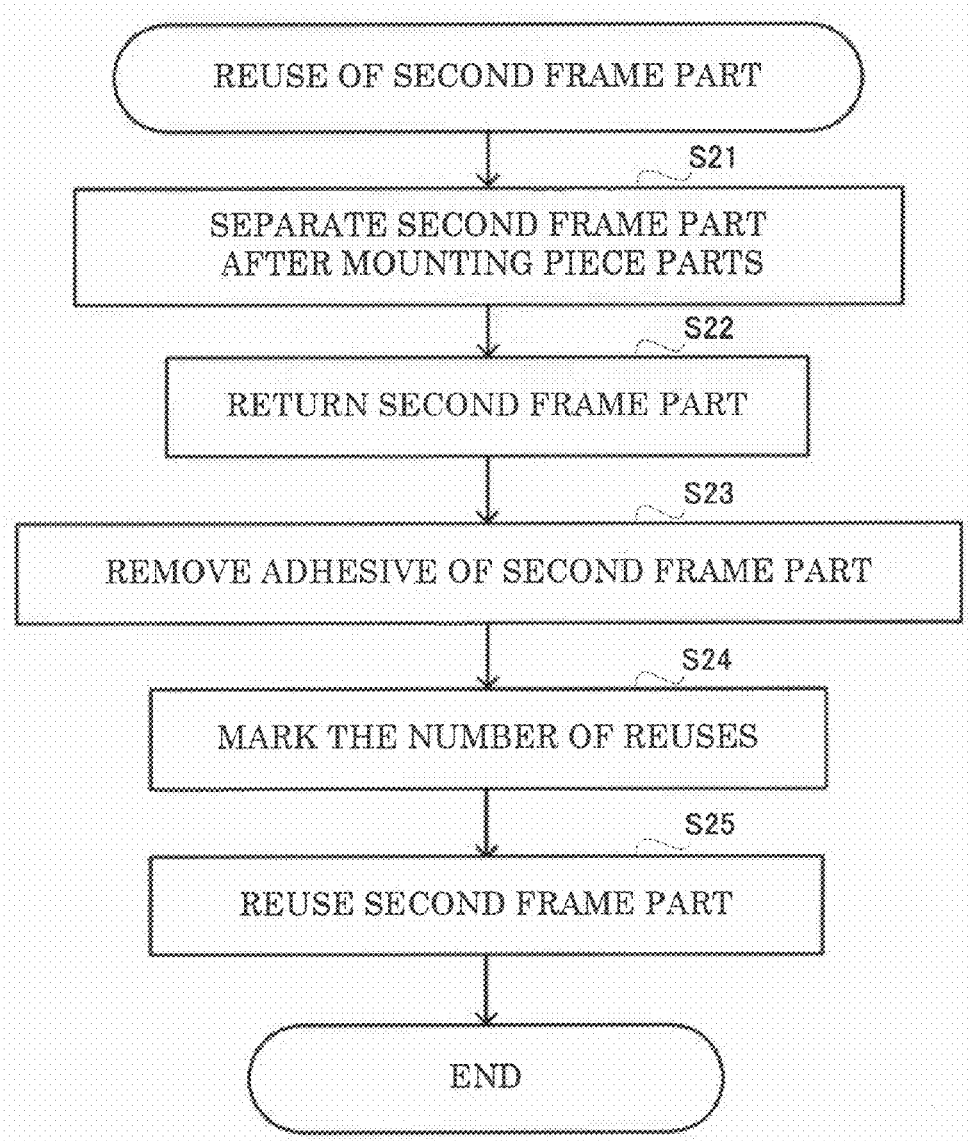
FIG. 8 is a flowchart for explaining a step of reusing a second frame part.

In the process of FIG. 8, the second frame parts 201 and 202 are separated from the multi-piece board 10 in step S21. Then, the second frame parts 201 and 202 can be returned from the customer to the manufacturer in step S22.

The manufacturer receives the second frame parts 201 and 202 from the customer. Then, the adhesive adhered to the second frame parts 201 and 202 is removed in step S23.

In next step S24, the number of times the second frame parts 201 and 202 are reused is marked. The marking scheme is optional; for example, marking may be carried out by needle imprinting, laser imprinting, scribing, adhesion of a seal, application of an ink, printing, baking or the like.

A mark indicating the number of reuses is used to manage, for example, the second frame parts 201 and 202. Specifically, when stress or heat is applied to the second frame parts 201 and 202, deformation or discoloration thereof is likely to occur. This causes the color tone of the second frame parts 201 and 202 reused to become dull. Therefore, there occurs a difference in color tone between the reused second frame parts 201 and 202 and the board main parts 101 and 102 based on the difference in heat history. This color tone difference can be measured by using a chromatoscope or color analyzer. In this respect, the fabrication method of the embodiment marks the number of reuses to manage the second frame parts 201 and 202. Accordingly, the second frame parts 201 and 202 can be replaced with new ones at an adequate timing in consideration of the number of reuses or the degree of deterioration of the second frame parts 201 and 202. To measure the stress, the heat history, the degree of deterioration or the like of the second frame parts 201 and 202, for example, it is effective to measure the transition temperature based on DSC (Differential Scanning Calorimetry) or DTA (Differential Thermal Analysis).

Next, through a cleaning step, correction step or so as needed, the second frame parts 201 and 202 are reused in step S25. That is, in step S14 in FIG. 2, those second frame parts 201 and 202 are used. The second frame parts 201 and 202 can be used repeatedly because of their thermotolerance.

According to the fabrication method, portions (second frame parts) of the frame parts 11a and 11b are prepared as separate from the board main parts. A larger number of board main parts can be produced at the production panel 100, thus making it possible to improve the yield and the number of yielded products. In addition, the reuse of the material for the second frame parts can achieve resource saving.

According to the fabrication method, those board main parts which are determined as being defect-free in the examination process in step S12 are combined. This eliminates defective pieces beforehand.

According to the fabrication method, the reuse of the previously used second frame parts 201 and 202 are reused. This leads to cost reduction, and excellent environmental solution.

According to the fabrication method, the common second frame parts 201, 202 are connected to a plurality of board main parts 101 and 102. The eight piece parts 12a to 12d, and 22a to 22d are distributed to the two board main parts 101 and 102, so that when one piece part is defective, for example, the board main part which does not include the defective piece part need not be discarded. This improves the yield and the number of yielded products.

According to the fabrication method, the board main parts 101 and 102 and the second frame parts 201 and 202 are connected together by a heat-hardening adhesive (e.g., epoxy adhesive). The adhesion can be made more reliable by using the heat-hardening adhesive which has stronger adhesion power than a photo-curing adhesive or the like.

Although the multi-piece board and the fabrication method therefor according to one embodiment of the invention are described above, the invention is not limited to the embodiment.

Figure 9:
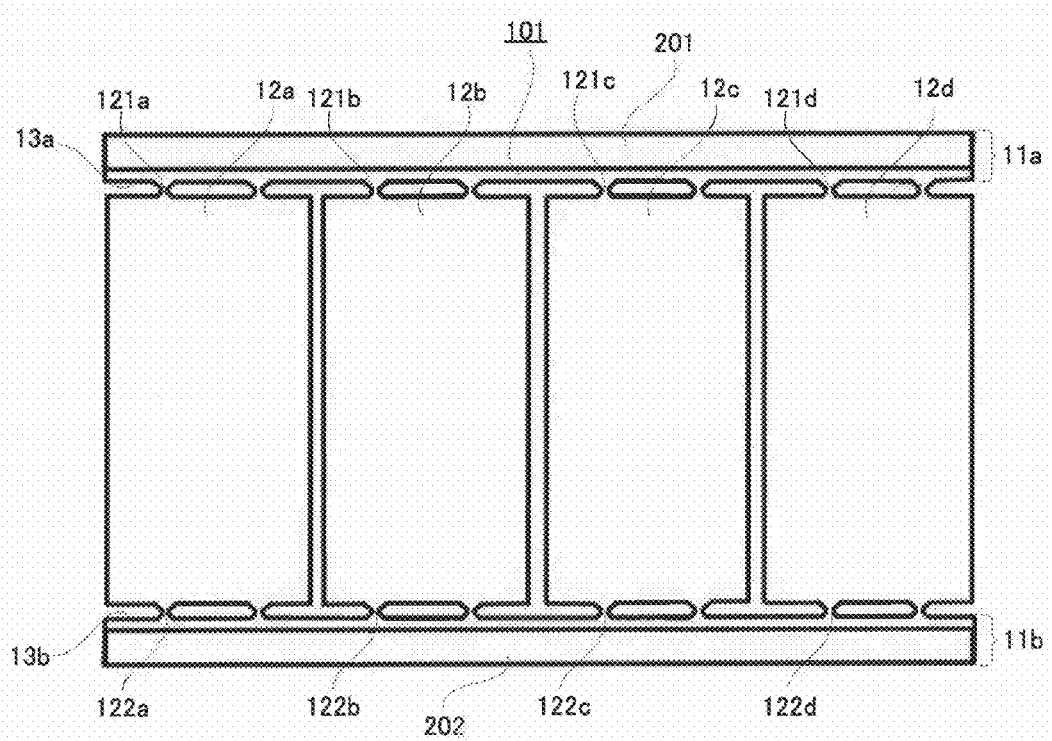
FIG. 9 is a diagram showing another example of the multi-piece board to be fabricated.

The fabrication target is not limited to the multi-piece board 10 shown in FIG. 1, and an arbitrary multi-piece board can be fabricated according to the purpose or the like. For example, the board main parts 101 and 102 each having four piece parts are combined into the multi-piece board 10 shown in FIG. 1 in the embodiments, which is not restrictive. As shown in FIG. 9, for example, the fabrication target may be a multi-piece board having only one board main part 101. Further, three or more board main parts may be combined into a multi-piece board. In addition, the number of piece parts a single board main part has is optional.

In the adhesion step, an adhesive other than a heat-hardening adhesive may be used. For example, a non-heat-hardening adhesive, such as a photo-curing adhesive or two-component type acrylic adhesive, can be used. The non-heat-hardening adhesive is an adhesive whose hardening does not require a heat treatment. The photo-curing adhesive is an adhesive which is hardened by irradiation of electromagnetic waves, such as ultraviolet rays, visible rays. The non-heat-hardening adhesive can suppress a change (cure shrinkage or the like) in the shape of the board originating from a temperature change. For example, a UV (UltraViolet rays) curing adhesive and an acrylic adhesive or the like are effective as a non-heat-hardening adhesive.

However, the non-heat-hardening adhesive has lower adhesion power than the heat-hardening adhesive. In this respect, after adhesion with a non-heat-hardening adhesive (temporal attachment), for example, the temporarily-attached portions may be reinforced by, for example, a heat-hardening adhesive. The temporal attachment with the non-heat-hardening adhesive beforehand suppresses a change (cure shrinkage or the like) in the shape of the board originating from a temperature change at the time of performing a heat treatment to harden the heat-hardening adhesive. Further, the reinforcement with the heat-hardening adhesive having high adhesion power ensures surer adhesion.

The second frame parts 201 and 202 may be formed of the same material as that for the board main parts 101 and 102. In this case, the reuse of the second frame parts 201 and 202 makes the color tone of the second frame parts 201 and 202 different from the color tone of the board main parts 101 and 102. As mentioned above, the difference in color tone between the second frame parts 201 and 202 and the board main parts 101 and 102 can be measured by using a chromatoscope or color analyzer.

Any material, if reusable, may be used for the second frame parts 201 and 202. For example, the second frame parts 201 and 202 formed of a paper phenolic material may be used according to the purpose or so.

The sequential order of the processes in the embodiments is not limited to those illustrated in the flowcharts, and can be changed without departing from the scope and spirit of the invention. Further, some processes may be omitted according to the purpose or the like. For example, marking the number of reuses of the second frame parts 201 and 202 may be omitted if unnecessary according to the purpose or the like.

The materials and sizes of the individual layers, the number of the layers, and so forth can be changed in the embodiments. The method of connecting the board main part to the second frame part is not limited to an adhesive, and is optional. For example, both may be connected together by fitting or the like.

Obviously, numerous modifications and variations of the present invention are possible in light of the above teachings. It is therefore to be understood that within the scope of the appended claims, the invention may be practiced otherwise than as specifically described herein.

The invention claimed is:

1. A multi-piece board comprising:
a board main portion comprising a first frame element and
a plurality of piece portions each comprising a printed wiring board, wherein the first frame element is provided in a pair such that the pair of first frame elements are connected to the plurality of piece portions on opposite ends of the piece portions; and a second frame element adhered to the first frame element of the board main portion such that the second frame element is connected to the first frame element along an opposite side of the piece portions with respect to the first frame element, wherein the first frame element separates from the board main portion of the multi-piece board, and the first frame element and the second frame element form a frame portion of the multi-piece board.

2. The multi-piece board according to claim 1, wherein the second frame element comprises a same material as a material of the board main portion and is different in color tone from the board main portion.

3. The multi-piece board according to claim 1, wherein the second frame element comprises a material different in heat deterioration from a material of the board main portion.

4. The multi-piece board according to claim 1, wherein the second frame element comprises a material having a heat resistance to a mounting temperature of an electronic component.

5. The multi-piece board according to claim 1, wherein the second frame element is configured to be marked for a number of reuses.

6. The multi-piece board according to claim 1, wherein the second frame element is provided in a pair such that the pair of second frame elements are connected to the pair of first frame elements along opposite sides of the piece portions with respect to the first frame elements, respectively.

7. A method of fabricating a multi-piece board having a frame and piece parts, the method comprising:

adhering a first frame element connected to a plurality of piece portions to a second frame element such that the second frame element is connected to the first frame element along an opposite side of the piece portions with respect to the first frame element, the first frame element forming a board main portion of a multi-piece board, the first frame element and the second frame element being configured to form a frame portion of the multi-piece board, thereby yielding the multi-piece board;

mounting a plurality of electronic components on the plurality of piece portions, respectively;

separating the plurality of piece portions from the frame portion;

separating, from the first frame element, the second frame element adhered thereto; and adhering the second frame element to a first frame element of a different board main portion such that the second frame element is connected to the first frame element of the different board main portion along an opposite side of a plurality of piece portions connected to the first frame element of the different board main portion with respect to the first frame element of the different board main portion;

wherein the first frame element is provided in a pair such that the pair of first frame elements are connected to a plurality of piece portions on opposite ends of the piece portions.

8. The method according to claim 7, wherein the second frame element comprises a same material as a material of the first frame element of the another board main portion and is different in color tone from the first frame element of the another board main portion.

9. The method according to claim 7, wherein the second frame element comprises a material different in heat history from a material of the board main portion.

10. The method according to claim 7, wherein the second frame element comprises a material having a heat resistance to a mounting temperature of the electronic components.

11. The method according to claim 7, further comprising recycling the second frame element for reuse.

12. The method according to claim 7, wherein the second frame element comprises a metal.

13. The method according to claim 7, wherein the second frame element comprises aluminum.

14. The method according to claim 7, wherein the second frame element and the first frame element of the another board main portion are adhered by an adhesive.

15. The method according to claim 7, wherein the second frame element is provided in a pair such that the pair of second frame elements are connected to the pair of first frame elements along opposite sides of the piece portions with respect to the first frame elements, respectively.

* * * * *